(12) United States Patent
Schenzinger et al.

(10) Patent No.: US 9,614,663 B2
(45) Date of Patent: Apr. 4, 2017

(54) METHOD AND DEVICE FOR SERIAL DATA TRANSMISSION OVER A BIDIRECTIONAL DATA CHANNEL

(71) Applicant: DR. JOHANNES HEIDENHAIN GmbH, Traunreut (DE)

(72) Inventors: Daniel Schenzinger, Palling-Freutsmoos (DE); Stephan Kreuzer, Surberg-Ettendorf (DE); Michael Walter, Polling (DE); Thomas Fleischmann, Laufen (DE); Markus Mooshammer, Traunstein (DE); Bernhard Beaury, Uebersee (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 0 days.

(21) Appl. No.: 14/856,589

(22) Filed: Sep. 17, 2015

(65) Prior Publication Data

US 2016/0094336 A1     Mar. 31, 2016

(30) Foreign Application Priority Data

Sep. 26, 2014   (DE) ........................ 10 2014 219 512

(51) Int. Cl.
    *H04L 7/04*     (2006.01)
    *H04L 25/49*     (2006.01)
(Continued)

(52) U.S. Cl.
CPC ............... *H04L 7/044* (2013.01); *H04L 5/18* (2013.01); *H04L 7/041* (2013.01); *H04L 25/08* (2013.01);
(Continued)

(58) Field of Classification Search
CPC ... H04L 12/413; H04L 25/4904; H04L 25/08; H04L 43/0847; H04L 7/044;
(Continued)

(56) References Cited

U.S. PATENT DOCUMENTS 4,726,018 A     2/1988    Bux et al.
5,050,194 A  *   9/1991    Pickering ............ H04L 25/4904
                                                    327/7

(Continued)

FOREIGN PATENT DOCUMENTS

DE           3788604 T2     6/1994
DE       102008027902 A1    12/2009
WO    WO 2009149966 A1    12/2009

*Primary Examiner* — Michelle M Koeth
(74) *Attorney, Agent, or Firm* — Leydig, Voit & Mayer, Ltd.

(57) ABSTRACT

A method for serial data transmission between a position-measuring device and subsequent electronics over a bidirectional data channel includes transmitting data in data frames and in encoded form in accordance with a data transmission code. The data transmission in each case is initiated by an interface unit at a transmitter end with a start sequence having an encoding scheme that at least partially differs from an encoding scheme of a remainder of the data frames. After a reversal of data direction, an interface unit at a receiver end detects a beginning of the data transmission in each case by detection of the start sequence.

7 Claims, 5 Drawing Sheets

(51) Int. Cl.
*H04L 25/08* (2006.01)
*H04L 5/18* (2006.01)
*H04L 29/06* (2006.01)
*H03M 5/12* (2006.01)
*H04L 25/02* (2006.01)

(52) U.S. Cl.
CPC ........ *H04L 25/491* (2013.01); *H04L 25/4904* (2013.01); *H04L 25/4906* (2013.01); *H04L 25/4908* (2013.01); *H04L 65/607* (2013.01); *H03M 5/12* (2013.01); *H04L 25/0272* (2013.01)

(58) Field of Classification Search
CPC .............. H04L 65/607; H04L 25/4908; G05B 2219/33187; H03M 5/12
See application file for complete search history.

(56) References Cited

U.S. PATENT DOCUMENTS

| | | | |
|---|---|---|---|
| 5,162,791 A * | 11/1992 | Heegard | H03M 5/12 370/445 |
| 6,795,402 B1 * | 9/2004 | Richardson | H04L 12/2697 370/241 |
| 2003/0233598 A1 * | 12/2003 | Wiley | G06F 11/0709 714/25 |
| 2006/0268943 A1 * | 11/2006 | DeCusatis | H04J 3/1617 370/539 |
| 2011/0116501 A1 * | 5/2011 | Beaury | H04L 25/4904 370/389 |

* cited by examiner

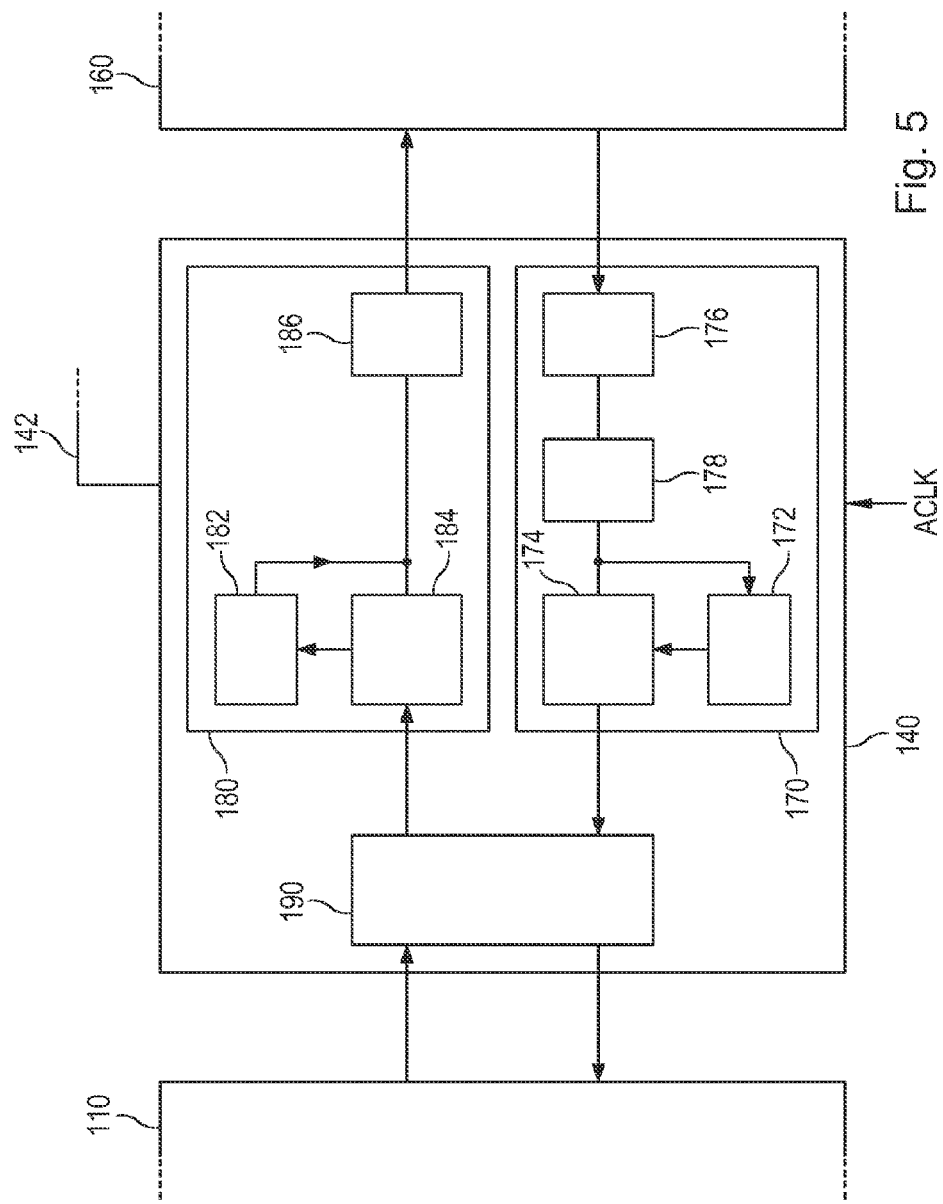

METHOD AND DEVICE FOR SERIAL DATA TRANSMISSION OVER A BIDIRECTIONAL DATA CHANNEL

CROSS-REFERENCE TO PRIOR APPLICATION

Priority is claimed to German Patent Application No. DE 10 2014 219 512.8, filed on Sep. 26, 2014, the entire disclosure of which is hereby incorporated by reference herein.

FIELD

The present invention relates to a method for serial data transmission between a position-measuring device and subsequent electronics over a bidirectional data channel, and a corresponding device.

BACKGROUND

Position-measuring devices are used in automation technology, for example, to determine, in closed-loop drive mechanisms, actual position values which are needed by subsequent electronics, such as a numerical control system, to calculate setpoints for control circuits used to control the drive mechanism (e.g., the feed rate of a tool or workpiece). If the position-measuring devices are in the form of rotary encoders or angle-measuring devices, then these are directly or indirectly coupled, for example, to the shaft of a motor for this purpose. Length-measuring devices measure, for example, linear movements between a machine bed and a machine part that is positionable relative to the machine bed, such as, for example, a movable tool carriage.

Today, absolute position-measuring devices are preferably used. Such devices generate absolute measurement values, which are transmitted from the position-measuring device to the subsequent electronics via digital, mostly serial data interfaces. The measurement values are mostly position values (angular values or linear positions), but there are also known position-measuring devices which deliver velocity or acceleration values; i.e., measurement values which indicate changes in positions over time.

A not-to-be underestimated cost factor in the connection of position-measuring devices to subsequent electronics, such as, for example, a machine tool controller, is the number of electrical lines required for operation, because these largely determine the cost of the high-quality data cables used. For this reason, there is an increasing tendency to use serial interfaces where data transmission takes place over only one bidirectionally operated data channel. A serial interface of this type is described in WO 2009/149966 A1. In order to be able to span the sometimes large distances between the position-measuring device and the subsequent electronics, the signals are transmitted differentially over the main transmission path according to the known RS-485 standard. In this case, a single line pair is necessary for the signal transmission. The position-measuring device and the subsequent electronics are each provided with suitable line drivers and receivers for transmitting and receiving data.

In order to reverse the data direction, the transmitting device deactivates its line drivers after the data frame to be transmitted has been completely output. Once the receiving device has received the complete data frame, it activates its line drivers and thus becomes the transmitting device, which in turn outputs a data frame to the data channel. During the period of time between the deactivation of the line drivers at one end and the activation of the line drivers at the other end, the line pair is high-ohmic with respect to the connected devices and is therefore susceptible to spurious signals. This time period is largely dependent on the propagation delay of the signals on the lines. In order for the receiving device to reliably detect the beginning of a data transmission after a reversal of the data direction, the transmitting device always first transmits a start sequence (preamble). However, it has been found that, under unfavorable conditions, signal reflections can lead to misidentification of a start sequence.

Signal reflections occur when the data transmission link is not optimally terminated; i.e., when a terminating resistance at the receiver end is not optimally matched to a line impedance of the line pair used for the data channel. In this case, signals arriving at the receiver are reflected and returned to the transmitter. When the data direction is reversed, the original transmitter becomes the receiver of the reflected signals. If these signals happen to contain the bit pattern of the start sequence, this may be misinterpreted as the beginning of a data transmission.

This problem can be circumvented by not activating the line receiver of the receiving unit until the signal reflections resulting from a data transmission have reliably decayed. However, this results in undesired lengthening of the access cycles and, therefore, is to be avoided.

SUMMARY

In an embodiment, the present invention provides a method for serial data transmission between a position-measuring device and subsequent electronics over a bidirectional data channel. Data is transmitted in data frames and in encoded form in accordance with a data transmission code. The data transmission in each case is initiated by an interface unit at a transmitter end with a start sequence having an encoding scheme that at least partially differs from an encoding scheme of a remainder of the data frames. After a reversal of data direction, an interface unit at a receiver end detects a beginning of the data transmission in each case by detection of the start sequence.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 5 is a block diagram of an interface unit of the subsequent electronics.

DETAILED DESCRIPTION

In an embodiment, the present invention provides a method for transmitting data between a position-measuring device and subsequent electronics that enables reliable detection of the beginning of a data transmission.

According to an embodiment, a method is provided for serial data transmission between a position-measuring device and subsequent electronics over a bidirectional data channel, where data is transmitted in data frames and in encoded form in accordance with a data transmission code, and where the data transmission is in each case initiated by an interface unit at the transmitter end with a start sequence whose encoding scheme at least partially differs from the encoding scheme of the remainder of the data frame, and where, after a reversal of the data direction, an interface unit at the receiver end detects the beginning of the data transmission in each case by detection of the start sequence.

Another embodiment of the present invention provides a device for data transmission between a position-measuring device and subsequent electronics that enables reliable detection of the beginning of a data transmission.

According to an embodiment, a device is provided for serial data transmission between a position-measuring device and subsequent electronics over a bidirectional data channel, where the position-measuring device and the subsequent electronics are each provided with one interface unit in which data frames are generatable from data and/or instructions to be transmitted that are deliverable thereto from source components, and in which the data frames are encodable in accordance with a data transmission code and outputtable to the data channel, and where the data transmission is in each case initiatable by the transmitter with a start sequence whose encoding scheme at least partially differs from the encoding scheme of the remainder of the data frame, and where, after a reversal of the data direction, the beginning of the data transmission is in each case detectable in the interface unit at the receiver end by detection of the start sequence.

Other advantages and details of a method and a corresponding device according to embodiments of the present invention will become apparent from the following description of the exemplary embodiments.

Figure 1:
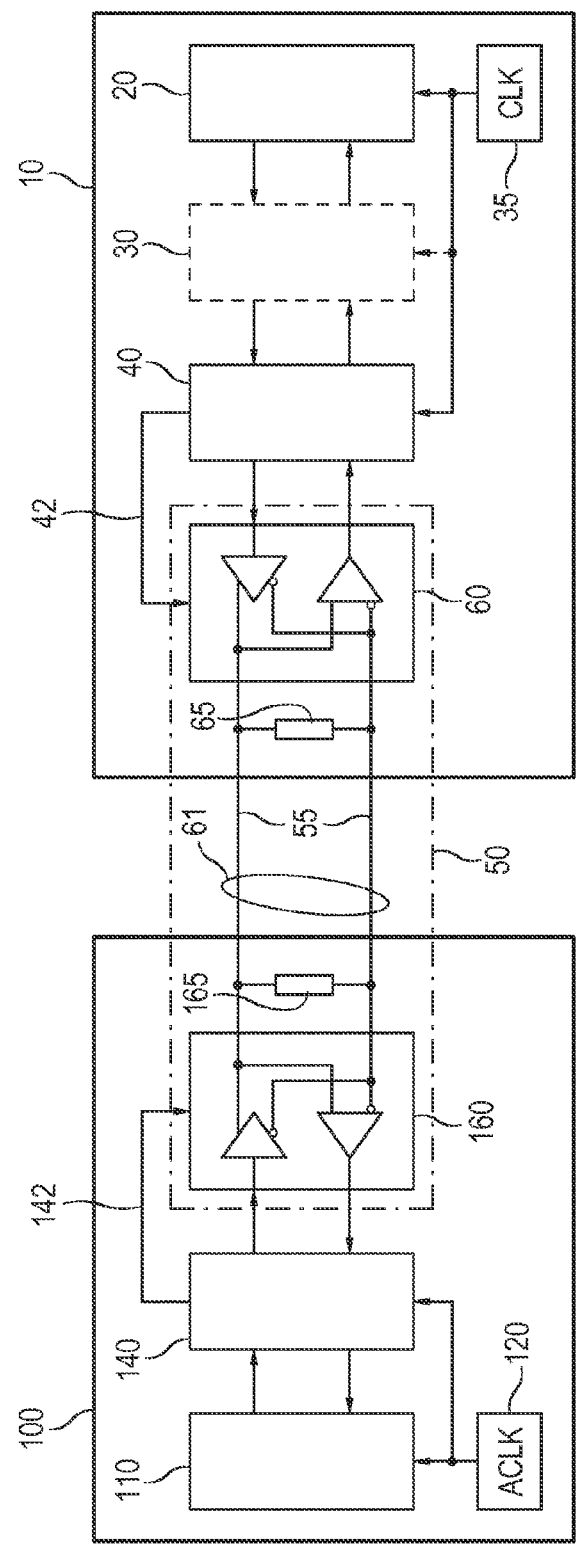
FIG. 1 is a block diagram of a position-measuring device and subsequent electronics which are interconnected via a bidirectional data channel.

FIG. 1 shows a block diagram of a position-measuring device 10 and subsequent electronics 100 which are interconnected via a bidirectional data channel 50.

Position-measuring device 10 has measuring device components in the form of a position-sensing unit 20 and an optional processing unit 30. Position-sensing unit 20 is suitably adapted to generate digital position values. For this purpose, it may, for example, include a measuring standard having a measuring graduation, a scanning unit for scanning the measuring graduation, as well as signal-processing electronics for generating the digital position value from the scanning signals of the scanning unit, which are generated by scanning the measuring graduation. The measuring standard and the scanning unit are arranged, in known manner, to be movable relative to each other, and are mechanically connected to machine parts whose relative position is to be measured. If position-measuring device 10 is a rotary encoder to measure the angular position of the shaft of an electric motor, then the scanning unit (or the housing of the rotary encoder) may be attached, for example, to a motor housing, and a shaft of the rotary encoder, which shaft is non-rotatably connected with the measuring standard, is connected to the motor shaft to be measured via a shaft coupling.

Also provided in position-measuring device 10 is a clock generator 35, in particular to provide a time base; i.e., a defined time pattern, for the digital circuit elements. The clock generator delivers a clock signal CLK which is fed to digital finite-state automatons, microprocessors, microcontrollers, etc.

The physical scanning principle underlying position-sensing unit 20 is irrelevant to the present invention. It may, for example, be an optical, magnetic, capacitive or inductive scanning principle. Depending on the processing steps required to process the scanning signals of the scanning unit into position values, the signal-processing electronics includes functional units performing processing steps such as amplification, signal correction (offset correction, amplitude correction, phase correction), interpolation, counting grating periods, and A/D conversion, . . . .

Suitable signal lines are provided for transmission of control signals and/or data between position-sensing unit 20 and processing unit 30. The signal lines serve in particular to transmit the position values generated in position-sensing unit 20 to processing unit 30.

In processing unit 30, the position values may be processed further, if necessary, to obtain output data. For this purpose, processing steps such as scaling, changing the data format, error correction, etc. may be required, which are performed purely digitally in processing unit 30. However, output data may not only be position values, but also velocity or acceleration values that are calculated in processing unit 30 from a plurality of successively generated position values.

Further provided in position-measuring device 10 is an interface unit 40 for communicating with subsequent electronics 100, on the one hand, and with measuring device components 20, 30, on the other hand. In particular, the output data is transmitted via interface unit 40 to subsequent electronics 100. The output data is transmitted to interface unit 40 via suitable signal lines from processing unit 30 or position-sensing unit 20. Clock signal CLK is also fed to interface unit 40.

The physical connection for transmitting instructions and data between interface unit 40 of position-measuring device 10 and a corresponding interface unit 140 of subsequent electronics 100 is provided by bidirectional data channel 50. To this end, data channel 50 is associated with a transmitter/receiver unit 60 in position-measuring device 10 and with a corresponding transmitter/receiver unit 160 in subsequent electronics 100, the transmitter/receiver units in turn being interconnected by an interface cable 61. In the present exemplary embodiment, transmitter/receiver units 60, 160 are suitably adapted to convert the respective instructions and/or data to be transmitted, which are mostly present in the form of single-ended signals, into differential signals according, for example, to the commonly used RS-485 standard, and to generate single-ended signals from the arriving differential signals. A line pair 55 is provided in interface cable 61 for signal transmission between transmitter/receiver units 60, 160. The two lines of line pair 55 are usually twisted together, so that interference effects, such as electromagnetic interference fields, interfere with the signals of both lines to the same extent. Since only the difference between the signals is decisive for the analysis, this way of routing signals is highly noise-immune.

As an alternative to wire-bound signal transmission, optical transmission (via fiber-optic cable) or wireless transmission via an air interface are also possible.

The data direction of transmitter/receiver units 60, 160 is controllable by the interface units 40, 140 associated therewith via a switchover signal 42, 142 capable of activating and deactivating transmitter/receiver units 60, 160. When reversing the data direction, the interface unit 40, 140 at the transmitter end deactivates the line drivers of its transmitter/receiver unit 60, 160 after the transmission (the output of a data frame) is complete, and the interface unit 40, 140 at the receiver end activates the line drivers of its transmitter/receiver unit 60, 160 once the arriving data frame has been completely received and thereby becomes ready to transmit.

Line terminations 65, 165 are provided at the inputs of the transmitter/receiver unit 60, 160, respectively. The line terminations serve particularly to prevent signal reflections from occurring at the receiver end during the reversal of the data direction. Signal reflections occur when the input impedance of the receiver (of transmitter/receiver unit 60, 160) is not matched to the line impedance of the line pair 55 used for signal transmission. In practice, simple ohmic resistors having a value corresponding to the impedance of line pair 55 are mostly used as line terminations 65, 165. Thus, if the impedance of twisted line pair 55 is 120 ohms, for example, then the two lines are bridged by a resistor of 120 ohms at both ends of interface cable 61; i.e., at the input of each transmitter/receiver unit 60, 160. However, there are also known more complex line terminations 65, 165 which, in addition to passive components (e.g., resistors), may also contain active components.

Since the line impedance is dependent on many factors, signal reflections cannot be completely prevented, but only reduced (attenuated) by line terminations 65, 165. In particular, in the case of bidirectionally operated data channels 50, in which signals are transmitted in both directions through reversal of the data direction, it is necessary to prevent signal reflections from being erroneously identified as a regular data transmission.

The manner in which communication is performed between subsequent electronics 100 and position-measuring device 10 is defined in an interface protocol. Often, a so-called request/response scheme is employed; i.e., during a communication cycle, subsequent electronics 100 (master) sends an instruction, possibly followed by data, to position-measuring device 10 (slave), which processes the instruction and may transmit requested data to subsequent electronics 100. Instructions may generally be write and/or read commands, for example, to write to or read from memory cells in processing unit 30. A special position request command may be provided for requesting a position value as an output datum to subsequent electronics 100.

Like all operations in subsequent electronics 100, accesses to position-measuring device 10 are also controlled by an internal control unit 110. If subsequent electronics 100 is a numerical control system or any other controller used in automation technology, then control unit 110 may, for example, continuously request position values from position-measuring device 10 via interface unit 140 in order to obtain actual position values (actual location values) needed for control circuits in order, for example, to precisely position mechanical components of a machine by means of a drive (servo drive).

Subsequent electronics 100 also includes a clock generator 120 which generates a clock signal ACLK that is fed to control unit 110 and interface unit 140 for generating a time base; i.e., a time pattern.

Instructions and data are transmitted by interface units 40, 140 in the form of data frames structured according to the definitions of the data transmission protocol. The following is a list of several typical components of data frames:

Start Sequence (Preamble)

The start sequence initiates the transmission of a data frame and serves to tell the respective receiving unit to expect instructions and/or data. In accordance with the present invention, the start sequence is designed to be uniquely identifiable, even when signal reflections occur.

Instruction

Instructions are usually transmitted only from the master (subsequent electronics 100) to the slave (position-measuring device 10) and indicate the type of access (e.g., read or write access). Instructions can have a defined length, such as 8 bits.

Receive Data

Receive data is data that is transmitted from the master (subsequent electronics 100) to the slave (position-measuring device 10). Receive data may, inter alia, include addresses which, in the case of a read command, determine the memory address from which to read data, and in the case of a write command, indicate the memory address to which to write data.

Transmit Data

Transmit data is data that is requested by the master (subsequent electronics 100) by a command and which is transmitted from the slave (position-measuring device 10) to the master (subsequent electronics 100). Transmit data includes, in particular, the measurement values (e.g., position values) acquired in position-measuring device 10.

End Sequence (Postamble)

The end sequence terminates the transmission of the data frame. The end sequence may be a single bit (stop bit) or a defined bit sequence.

The receive and/or transmit data, and possibly also the end sequence, may additionally contain checksums (CRC) to enable detection of transmission errors at the receiver end.

In accordance with the present invention, the data frames are not transmitted in unencoded form (i.e., a form where the value of each bit is transmitted by means of its associated signal level for a defined signal duration), but in encoded form. To this end, encoding rules are applied by the transmitter to the data frame to be transmitted before it is transmitted in the form of a data stream over data channel 50. Analogously, decoding rules are applied to the arriving data stream at the receiver end to restore the original data frame.

Particularly advantageous encoding schemes include different variants of Manchester encoding where the bits to transmitted are encoded as signal edges. For example, in the Manchester encoding shown in FIG. 2, a logic "0" is replaced by a rising signal edge and a logic "1" is replaced by a falling signal edge. In this way, the above-illustrated bit sequence "0101000" to be transmitted becomes the encoded bit sequence "01100110010101." This has the advantage, firstly, that the change in signal level necessarily occurring for each bit to be transmitted enables checking of the data transmission and, secondly, the encoded bit sequence has no DC component, which makes it possible to transmit the encoded bit sequence and a supply voltage over the same line pair 55.

As a result of the Manchester encoding, a sequence of short symbols K having a duration $T_K$ and long symbols L having a duration $T_L$ are obtained for the encoded data stream. For purposes of checking the data transmission, it is possible, for example, to make use of the fact that in the case of regular encoding, short symbols K always occur in pairs; i.e., that an even number of short symbols K occurs. Thus, the occurrence of a single short symbol K or an odd number of successive short symbols K indicates a deviation from the encoding scheme of the remainder of the data frame.

Figure 2:
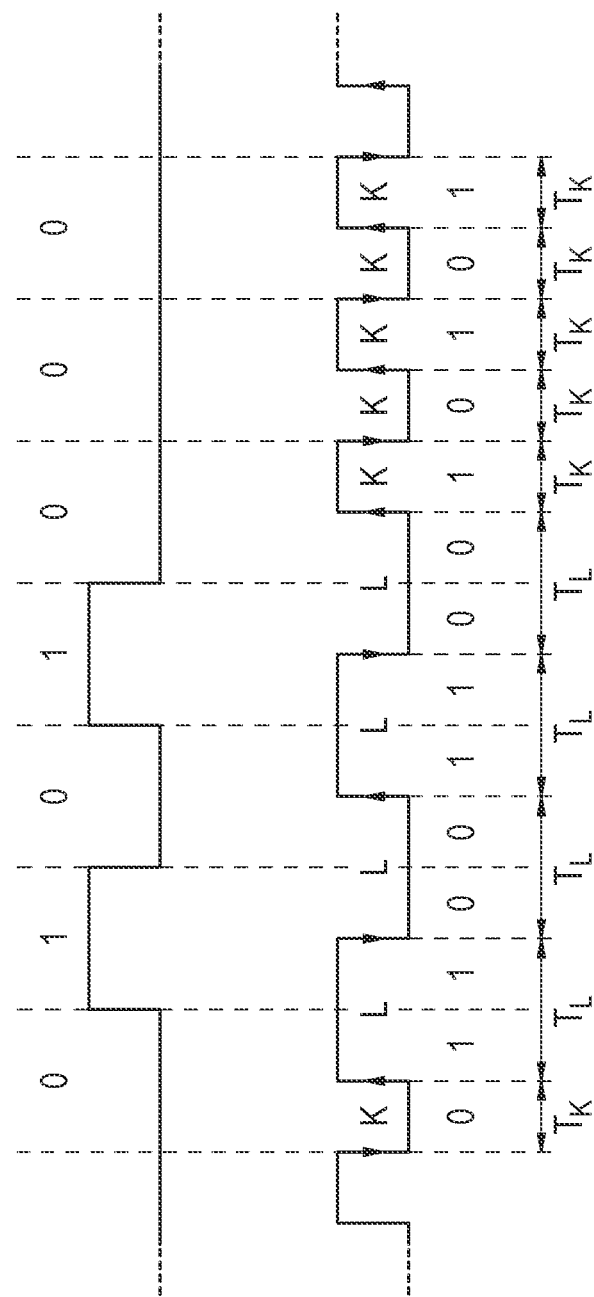
FIG. 2 is a signal diagram illustrating a Manchester encoding scheme.

Apart from the Manchester encoding variant illustrated in FIG. 2, the association between the signal edges and the logic levels may, of course, also be reversed. Differential Manchester encoding is also suitable.

Figure 3:
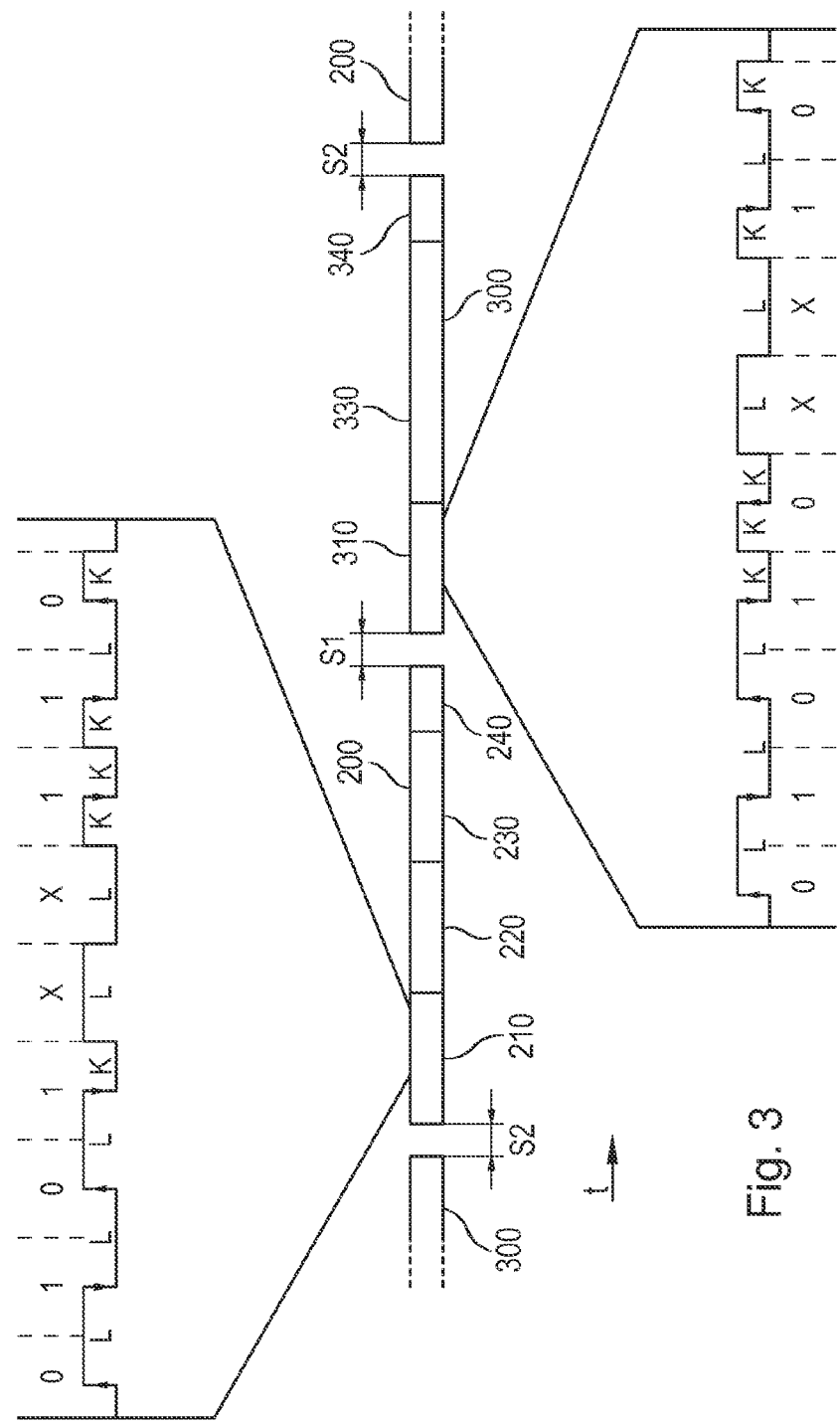
FIG. 3 is a signal diagram of a communication cycle according to an embodiment of the present invention.

FIG. 3 shows, by way of example, a communication cycle according to the present invention between subsequent electronics 100 and a position-measuring device 10. Initially, subsequent electronics 100 transmits a first data frame 200 to position-measuring device 10. After that, the data direction of data channel 50 is reversed in time window S1, and position-measuring device 10 transmits a second data frame 300 to subsequent electronics 100 in response to first data frame 200. Thus, in this example, subsequent electronics 100 functions as a master that requests data, and position-measuring device 10 functions as a slave that transmits data in response to the request from the master. Data frames 200, 300 are transmitted in Manchester-encoded form.

Time window S1 is determined to a substantial extent by the propagation delay of the signals through data channel 50, particularly the cable delay time through interface cable 61. The reason for this is that while transmitter/receiver unit 160 of subsequent electronics 100 can switch from transmit mode to receive mode immediately after the transmission of first data frame 200, transmitter/receiver unit 60 of position-measuring device 10 cannot switch over until first data frame 200 (which is delayed by the cable delay time) has been completely received.

First data frame 200 is initiated by a start sequence 210, which is followed by a command 220. Then, optionally, receive data 230 (as seen from the perspective of position-measuring device 10) may be transmitted before first data frame is terminated by an end sequence 240. Command 220 may, for example, be a position request command which prompts position-measuring device 10 to generate a position value and transmit it to subsequent electronics 100.

Second data frame 300 is also initiated by a start sequence 310. Since position-measuring device 10 operates as a slave, second data frame 300 includes only transmit data 330, but no command. Again, second data frame 300 is terminated by an end sequence 340. Transmit data 330 may include, for example, the position value generated in response to the position request command, as well as additional data. Additional data may, for example, be data obtained by evaluating additional sensors (e.g., temperature sensors) contained in position-measuring device 10, but may also be status information or any type of memory contents.

After transmission of end sequence 340, the data direction is reversed again in a further time window S2, so that subsequent electronics 100 can transmit a first data frame 200 again.

Especially in cases where the position values of position-measuring device 10 are needed as actual position values for a servo drive or the like, communication cycles occur one after another at short intervals, as indicated in FIG. 3. Thus, the above-mentioned risk of misidentification of start sequences exists not only between the end of first data frame 200 and the beginning of second data frame 300, but also between the end of second data frame 300 and the beginning of first data frame 200 (of the subsequent communication cycle).

In accordance with the present invention, start sequences 210, 310 of data frames 200, 300 are structured such that their encoding scheme at least partially differs from the encoding scheme of the remaining blocks of data frames 200, 300 (command 220, receive data 230, end sequence 240, or transmit data, end sequence 340, respectively). Since data streams caused by signal reflections have the Manchester encoding scheme on which the signal transmission is based, start sequences 210, 310 are now uniquely identifiable by the encoding scheme that differs from the Manchester encoding scheme.

In this example, the deviation from the encoding scheme lies in that, contrary to the Manchester encoding rules, no signal edges occur in regions X. Thus, neither a logic "0" nor a logic "1" can be associated with regions X. It is particularly advantageous if a signal edge occurs between two regions X, as shown in FIG. 3, because in this case, the frequency spectrum of the transmission remains unaffected in spite of the different encoding scheme.

Since in a Manchester-encoded data stream, there is always an even number of successive short symbols K, whereas the present deviation from the encoding scheme results in separately occurring short symbols K and/or an odd number of successive short symbols K, this type of deviation from the encoding scheme can be detected particularly easily during the analysis of the data stream.

Figure 4:
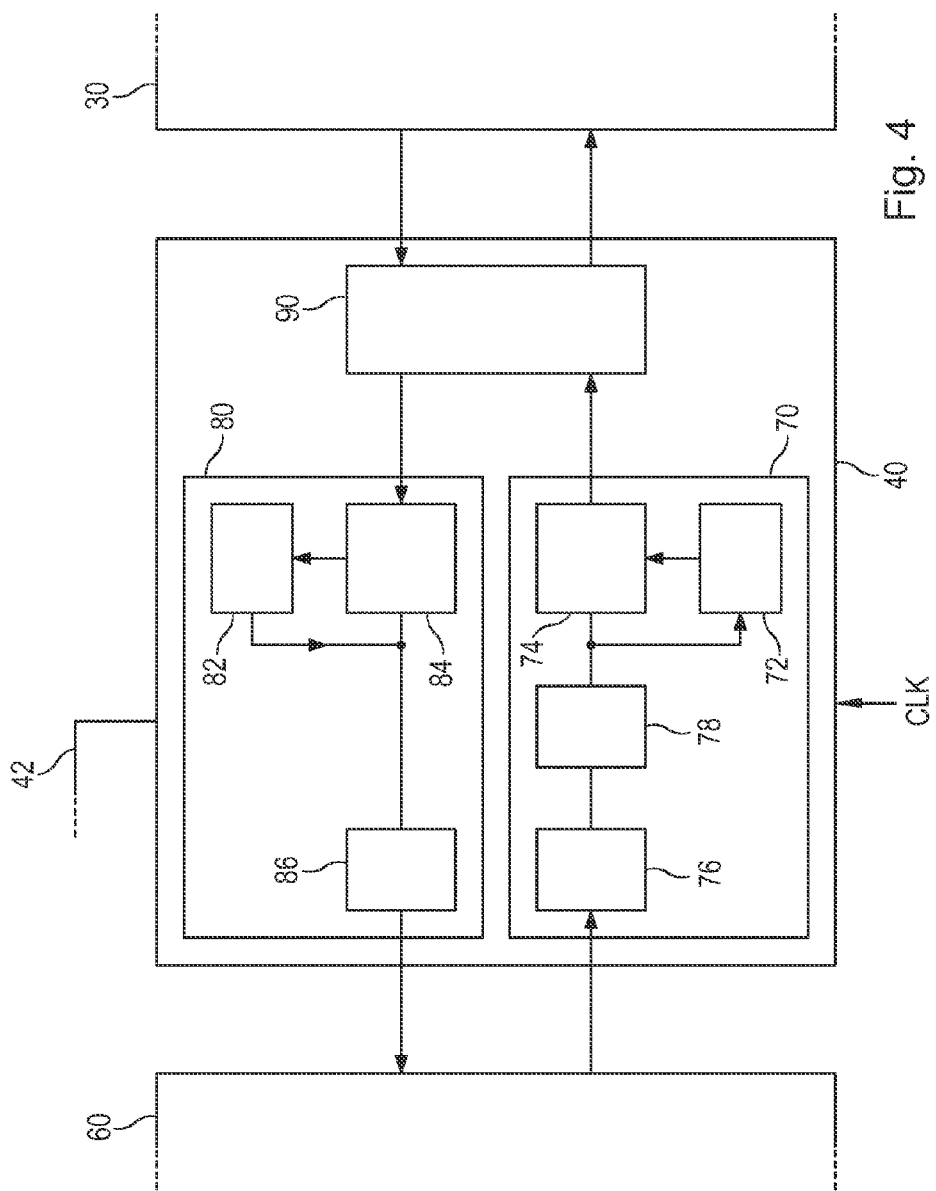
FIG. 4 is a block diagram of an interface unit of the position-measuring device.

FIG. 4 shows a block diagram of an inventive interface unit 40 of position-measuring device 10. Interface unit 40 includes a read unit 70, an output unit 80, as well as a communication unit 90.

Read unit 70 serves to read and process arriving data streams. To this end, it includes a comparator unit 72 to which the arriving data stream is fed. Comparator unit 72 compares the content of the data stream with a valid start sequence and if the comparison result is positive; i.e., if a valid start sequence 210 and thus the arrival of a first data frame 200 has been detected, indicates to a decoding unit 74 that a first data frame 200 is now to be processed. Decoding unit 74 decodes the remaining partial data frame (command 220, receive data 230, end sequence 240) and outputs the content thereof (command 220 and, possibly, receive data 230) in decoded form to communication unit 90.

Depending on the encoding scheme and the physical transmission of first data frame 200, some preprocessing may be necessary prior to analyzing the data stream in comparator unit 72 and decoding unit 74. In the present case, where the arriving data stream and the encoder electronics are based on different time patterns, the data stream is initially synchronized in a synchronization unit 76 with clock signal CLK of position-measuring device 10. The resulting synchronous data stream is fed to a symbol discriminator 78 which determines the sequence of short symbols K and long symbols L in the synchronous data stream and transmits only this information to decoding unit 74 for decoding. The content of the data stream arriving via data channel (50) is not changed by the preprocessing operation.

Communication unit 90 relays commands 220 and, possibly, receive data 230 to the respective addressed target components (e.g., position-sensing unit 20, processing unit 30, . . . ). Moreover, communication unit 90 receives transmit data 330, for example, from position-sensing unit 20 or processing unit 30, and in turn creates a partial data frame (which in this case includes transmit data 330 and an end sequence 340) and outputs it to an output unit 80 of interface unit 40. In this data direction, processing unit 30 and/or position-sensing unit 20 function as source components for the data transmission.

In output unit 80, partial data frame 330, 340 is encoded in an encoding unit 84. In order to output data frame 300, first, a start sequence output unit 82 outputs the missing start sequence 310 according to the present invention, and then encoding unit 84 outputs the partial data frame including transmit data 330 and end sequence 340.

Depending on the selected encoding scheme or the type of physical data transmission, the data stream output by start sequence output unit 82 and encoding unit 84 and representing second data frame 300 may also be further processed in output unit 80. Thus, for example, the data transfer rate of the data stream, which is in the present example is in the form of a sequence of short symbols K and long symbols L, may be adjusted in a transmission unit 86 before the data stream is output over bidirectional data channel 50 to subsequent electronics 100.

FIG. 5 shows a block diagram of an interface unit 140 of subsequent electronics 100 as a counterpart of the corresponding interface unit 40 of position-measuring device 10.

Interface units 40, 140 are configured symmetrically with respect to one another, so that each unit of interface unit 40 finds its counterpart in interface unit 140. Thus, for example, interface unit 140 also has a read unit 170 including a comparator unit 172 and a decoding unit 174. Moreover, a synchronization unit 176 and a symbol discriminator 178 may be provided, depending on the selected encoding scheme. Also provided is an output unit 180 including a start sequence output unit 182, an encoding unit 184 and a transmission unit 186. Only communication unit 190 differs from communication unit 90 in that it must also integrate commands 220 of control unit 110 into first data frames 200, while second data frames 300 arriving from position-measuring device 10 do not contain any commands to be processed. The reason for this is that the present exemplary embodiment is a master-slave system and, thus, only the master (subsequent electronics 100) initiates communication cycles whereas the slave (position-measuring device 10) only executes arriving commands.

Also known, however, are devices for data transmission where each participant can both transmit commands and receive and process commands. In such a device, the two communication units 40, 140 may be completely identical in configuration.

At the end of subsequent electronics 100, control unit 110 functions either as a source component or as a target component, depending on the data direction.

Also known are devices for data transmission where more than two participants communicate over a data channel 50.

To be able to distinguish which participant 10, 100 a data frame 200, 300 comes from, it is generally advantageous for data frames 200, 300 to have start sequences 210, 310 that are distinguishable from each other, in particular by different deviations from the encoding scheme of the remainder of the respective data frame 200, 300.

In addition to the described Manchester encoding, other bit encoding techniques, such as, for example, MLT-3 encoding or return-to-zero (RZ) encoding, may also be used. The term "bit encoding" is understood to refer to codes where each bit to be transmitted is individually encoded and transmitted. In Manchester encoding, for example, each bit is transmitted as a rising or falling signal edge; i.e., transmission takes place in the form of a 0-1 sequence or a 1-0 sequence. In MLT-3 encoding, the transmission of a logic "0" is encoded as a constant signal level, while the transmission of a logic "1" is encoded as a change in signal level. In RZ encoding, the bits are transmitted as positive or negative voltage pulses, and the voltage always returns to a neutral value (zero) between two bits.

Furthermore, it is also possible to use bit group codes; i.e., codes where a group of n bits (n>1) is in each case replaced by a group of m bits, with m>n. Bit group codes are typically used to obtain a data stream transmission that is substantially free of DC components. Moreover, in bit group encoding, it is possible to selectively cause forced bit changes, which facilitates clock recovery at the receiver end. A typical example is 4b5b encoding, where groups of 4 bits are replaced by groups of 5 bits. Here, bit groups which are not needed for encoding the remainder of the data frame (i.e., the partial data frame that is created in communication unit 90, 190 and includes first data frame 200 or second data frame 300 without the respective start sequence 210, 310) may be used for start sequence 210, 310. In this connection, it must be ensured that start sequence 210, 310 contains at least one group that cannot occur in the remainder of the data frame, even not in the transition region between two groups.

Finally, it is also possible to combine bit encoding with bit group encoding, for example, by subjecting a data frame first to bit group encoding (4b5b) and then to bit encoding (MLT-3). In any case, what is important is that the encoding scheme of start sequence 210, 310 differ from the encoding scheme of the remainder of the data frame.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for serial data transmission between a position-measuring device and subsequent electronics over a bidirectional data channel, the method comprising:
    transmitting data in data frames and in encoded form in accordance with a data transmission code, the data transmission in each case being initiated by an interface unit at a transmitter end with a start sequence having an encoding scheme that at least partially differs from an encoding scheme of a remainder of the data frames; and
    after a reversal of data direction, detecting, by an interface unit at a receiver end, a beginning of the data transmission in each case by detection of the start sequence,
    wherein the interface units at the receiver and transmitter ends each include a read unit and the read units each include a synchronization unit to which a data stream arriving over the data channel is delivered and which synchronizes the data stream with a clock signal,
    wherein the encoding scheme of the remainder of the data frames is a Manchester encoding scheme in which the data stream for transmitting the data frames contains a sequence of short symbols and long symbols and, in case of regular encoding, there is always an even number of successive short symbols in the data stream, and wherein the read units each include a symbol discriminator to which the synchronized data stream is fed by a respective one of the synchronization units and which determines the sequence of short symbols and long symbols in the synchronized data stream and transmits only the determined sequence to a respective decoding unit for decoding.

2. The method as recited in claim 1, wherein the interface units each include a communication unit and an output unit, the method further comprising:

generating, in a first respective one of the communication units, partial data packets from at least one of data and instructions to be transmitted that are delivered to the first respective communication unit from source components;

outputting the partial data packets to a respective one of the output units;

processing, by a second respective one of the communication units, the partial data packets delivered to the second respective communication unit from a respective one of the read units; and delivering the at least one of data and instructions contained in the partial data packets to addressed target components.

3. The method as recited in claim 2, wherein the output units each include a start sequence output unit and an encoding unit, the method further comprising:

encoding the partial data packets in a respective one of the encoding units; and outputting the data to the data channel, during which, first, a respective one of the start sequence output units outputs the start sequence and then the respective one of the encoding units outputs the partial data packets.

4. The method as recited in claim 2, wherein the read units each include a comparator unit and the respective decoding unit, the method further comprising:

comparing, by a respective one of the comparator units, the data stream arriving over the data channel with the start sequence; and signaling, by the respective comparator unit, a positive comparison result to the respective decoding unit, whereupon the respective decoding unit decodes the partial data packets and delivers the partial data packets to the second respective communication unit.

5. The method as recited in claim 1, wherein a deviation from the encoding scheme of the remainder of the data frames is provided by a single short symbol or an odd number of successive short symbols occurring between two long symbols at least once in the start sequence.

6. A device for serial data transmission between a position-measuring device and subsequent electronics over a bidirectional data channel, the device comprising:

the position-measuring device and the subsequent electronics each including an interface configured to generate data frames from at least one of data and instructions to be transmitted that are deliverable to the interfaces of the position-measuring device and the subsequent electronics from source components, the interfaces being configured to encode the data frames in accordance with a data transmission code and output the encoded data frames to the data channel, the interfaces being configured to initiate a data transmission in each case by a transmitter end with a start sequence whose encoding scheme at least partially differs from an encoding scheme of a remainder of the data frames and the interfaces being configured to detect in each case at a receiver end, after a reversal of data direction, a beginning of the data transmission by detection of the start sequence, wherein the interfaces each include a communicator, an outputter and a reader, and wherein the communicators are each configured to:

generate partial data packets from the at least one of data and instructions;

output the partial data packets to a respective one of the outputters; and receive and process the partial data packets from a respective one of the readers so that the at least one of data and instructions contained in the partial data packets are deliverable to addressed target components, wherein the readers each include a comparator and a decoder, the comparators being configured to compare a data stream of the partial data packets arriving over the data channel with the start sequence and to signal a positive comparison result to the decoder, and the decoders respective to the readers being configured to decode the partial data packets and to deliver the decoded partial data packets to a respective one of the communicators, wherein the readers each include a synchronizer configured to receive the data stream arriving over the data channel and to synchronize the data stream with a clock signal, and wherein the encoding scheme of the remainder of the data frames is a Manchester encoding scheme in which a data stream for the data transmission contains a sequence of short symbols and long symbols, and the readers include a symbol discriminator configured to receive the synchronized data stream from a respective one of the synchronizers, to determine the sequence of short symbols and long symbols in the synchronized stream and to transmit only the determined sequence to a respective one of the decoders for decoding.

7. The device as recited in claim 6, wherein the outputters each include a start sequence outputter and an encoder, the encoders being configured to encode the partial data packets, wherein the data of the encoded partial data packets is outputtable to the data channel by a respective one of the start sequence outputters first outputting the start sequence and then a respective one of the encoders outputting the encoded partial data packets.

* * * * *